(12) United States Patent
Gaertner et al.

(10) Patent No.: US 7,863,920 B2
(45) Date of Patent: Jan. 4, 2011

(54) ELECTROSTATIC DISCHARGE TEST SYSTEM AND ELECTROSTATIC DISCHARGE TEST METHOD

(75) Inventors: Reinhold Gaertner, Starnberg (DE); Wolfgang Stadler, Munich (DE); Harald Gossner, Riemerling (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/854,275

(22) Filed: Sep. 12, 2007

(65) Prior Publication Data

US 2009/0066354 A1   Mar. 12, 2009

(51) Int. Cl.
*G01R 31/26* (2006.01)
(52) U.S. Cl. ...................................... 324/765
(58) Field of Classification Search ............ 324/765
See application file for complete search history.

(56) References Cited

U.S. PATENT DOCUMENTS

| | | | |
|---|---|---|---|
| 5,132,612 A | | 7/1992 | Burns et al. |
| 5,451,883 A | * | 9/1995 | Staab .................. 324/758 |
| 5,523,699 A | * | 6/1996 | Miyagawa ............ 324/765 |
| 6,493,850 B2 | * | 12/2002 | Venugopal et al. ........ 716/4 |
| 7,375,541 B1 | * | 5/2008 | Chen et al. ............ 324/763 |
| 2007/0007984 A1 | | 1/2007 | Kojima et al. | 
| 2007/0018670 A1 | | 1/2007 | Ito et al. |
| 2008/0162062 A1 | * | 7/2008 | Kelkar et al. ............ 702/79 |

FOREIGN PATENT DOCUMENTS

WO   2007077495 A1   7/2007

OTHER PUBLICATIONS

International Standard (IEC 61000-4-2) Edition 1.2 (Apr. 2001), "Electromagnetic compatibility (EMC)—Part 4-2: Testing and measurement techniques—Electrostatic discharge immunity test", 44 pages.
International Standard (IEC 10605) First edition (Dec. 15, 2001), "Road vehicles—Test methods for electrical disturbances from electrostatic discharge," 26 pages.
JEDEC Standard "Electrostatic Discharge (ESD), Sensitivity Testing Human Body Model (HBM)", JESD22-A114E (Revision of JESD22-A114D), Mar. 2006), Jan. 2007, JEDEC Solid State Technology Association.

* cited by examiner

*Primary Examiner*—Ha Tran T Nguyen
*Assistant Examiner*—Shaun Campbell
(74) *Attorney, Agent, or Firm*—Banner & Witcoff, Ltd.

(57) ABSTRACT

A method of conducting an electrostatic discharge test on an integrated circuit is described. The method comprises configuring a test board assembly to emulate characteristics of a system in which the integrated circuit is to be used, coupling the integrated circuit to the test board assembly, and applying an electrostatic discharge test signal of system-level type to the test board assembly.

17 Claims, 4 Drawing Sheets

| Level | Test voltage kV | First peak current of discharge ±10% A | Rise time $t_R$ with discharge switch ns | Current (±30%) at 30 ns A | Current (±30%) at 60 ns A |
|---|---|---|---|---|---|
| 1 | 2 | 7,5 | 0,7 – 1 | 4 | 2 |
| 2 | 4 | 15 | 0,7 – 1 | 8 | 4 |
| 3 | 6 | 22,5 | 0,7 – 1 | 12 | 6 |
| 4 | 8 | 30 | 0,7 – 1 | 16 | 8 |

ELECTROSTATIC DISCHARGE TEST SYSTEM AND ELECTROSTATIC DISCHARGE TEST METHOD

BACKGROUND

It is known to test integrated circuits with respect to their robustness in case of an electrostatic discharge (ESD) event. Several models are known to perform such a test on a device level, e.g., according to the human body model or to the charged device model.

Further, ESD robustness tests can be performed on an entire electronic system, which typically comprises one or more integrated circuits and additional peripheral components, external connections, a housing, or the like. Hereinafter, such tests will be referred to as system-level tests. One standard for system-level tests is defined by IEC 61000-4-2.

However, the above methods do not allow to qualify an integrated circuit with respect to its behavior if the electronic system using the integrated circuit is subjected to an ESD event unless the entire electronic system is set up. At the same time, this behavior constitutes information useful with respect to designing the electronic system. In some cases, it may even be required to redesign the integrated circuit to meet system-level ESD specifications.

SUMMARY

In light of the foregoing background, the following presents a simplified summary of the present disclosure in order to provide a basic understanding of some aspects of the invention. This summary is not an extensive overview of the invention. It is not intended to identify key or critical elements of the invention or to delineate the scope of the invention. The following summary merely presents some concepts of the invention in a simplified form as a prelude to the more detailed description provided below.

One example of an aspect of the invention relates to a method of conducting an electrostatic discharge test on an integrated circuit. The method comprises configuring a test board assembly to emulate characteristics of a system in which the integrated circuit is to be used, coupling the integrated circuit to the test board, and applying an electrostatic discharge test signal of system-level type to the test board assembly.

These and other aspects will be described herein. This Summary is provided to introduce a selection of concepts in a simplified form that are further described below in the Detailed Description. The Summary is not intended to identify key features or essential features of the claimed subject matter, nor is it intended to be used to limit the scope of the claimed subject matter.

BRIEF DESCRIPTION OF THE DRAWINGS

The invention can be better understood with reference to the following drawings and description. The components in the figures are not necessarily to scale; instead, emphasis is placed upon illustrating the principles of the invention. Moreover, in the figures, like reference numerals designate corresponding parts. In the drawings.

DETAILED DESCRIPTION

The following detailed description explains illustrative embodiments of the present invention. The description is not to be taken in a limiting sense, but is made only for the purpose of illustrating the general principles of the invention.

In the following detailed description, any shown or described direct connection or coupling between two functional blocks, devices, components or other physical or functional units may also be implemented by indirect connection or coupling.

In the following, various illustrative embodiments will be described with reference to the accompanying drawings. The embodiments described hereinafter relate to an ESD test system and to a method of conducting a system-level ESD test on an integrated circuit. According to the illustrated embodiments, test signals are generated to correspond to a standard, such as the standard IEC 61000-4-2, which specifies ESD tests of the system-level type. In other embodiments, system-level type ESD test signals may be generated according to other standards, which are derived from the above-mentioned IEC 61000-4-2 standard, e.g., the ISO 10605 standard, or to other standards for system-level ESD tests, e.g., cable-discharge, and typical characterization methods like transmission-line pulsing (TLP). Typically, ESD test signals of the system level type have test voltages above 1 kV and peak discharge currents of more than 5 A. Further, a typical initial rise time of the current is below 2 ns.

An example of an aspect of the invention relates to a test board assembly for an electrostatic discharge test system. The assembly includes a receiving section configured to receive an integrated circuit to be tested, and a plurality of input connection terminals, each input connection terminal configured to be coupled to a test signal generator to receive an electrostatic discharge test signal of system-level type, wherein the test board assembly is configurable to emulate characteristics of a system in which the integrated circuit is to be used.

Still another example of an aspect of the invention relates to an electrostatic discharge test system. The system includes a test signal generator configured to generate an electrostatic discharge test signal of system-level type, and a flexibly configurable test board assembly configured to receive an integrated circuit to be tested, wherein the test signal generator and the test board assembly are configured to be coupled to each other to supply the electrostatic discharge test signal to the test board assembly.

Figure 1:
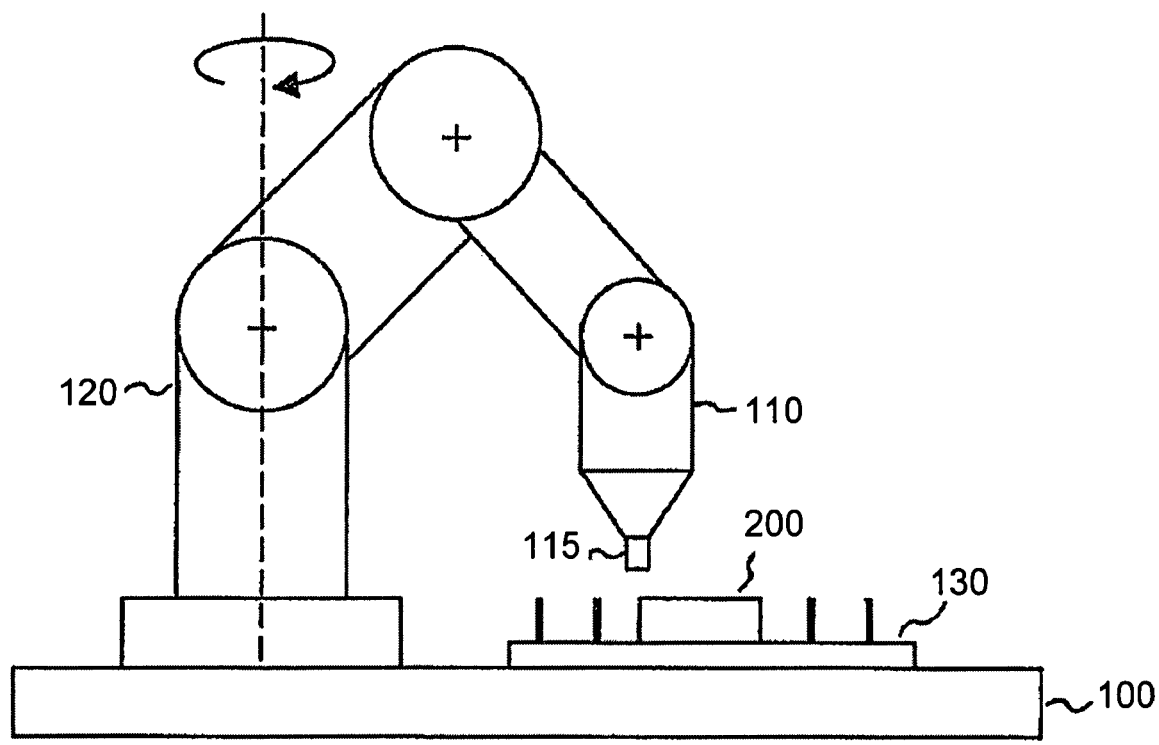
FIG. 1 schematically represents an electrostatic discharge test system in accordance with at least one aspect of the present invention.

FIG. 1 schematically illustrates an ESD test system in accordance with at least one aspect of the present invention. As illustrated, the ESD test system includes an ESD test signal generator 110, and a test board assembly 130. The test board assembly 130 includes a receiving section configured to receive an integrated circuit 200 to be tested. The test signal generator 110 includes a signal output portion 115 configured to be coupled to connection terminals of the test board assembly 130 to supply an ESD test signal to the test board assembly 130.

According to the illustrated embodiment, the test signal generator 110 is mounted on a robotic system 120 to be movable with respect to the test board assembly 130. As such, the signal output portion 115 may be brought into contact with different connection terminals of the test board assembly 130 in an automated manner. According to the illustrated embodiment, the robotic system 120 comprises a robotic arm with a plurality of rotation axes. By suitably controlling movement about the different axes, the signal output portion 115 of the test signal generator 110 may be moved in a plane parallel to a plane of the test board assembly 130 and in a direction perpendicular to the plane of the test board assembly 130. In other embodiments, the robotic system 120 may be implemented in a different manner, e.g., by mounting the test board assembly 130 on a table that is displaceable in a horizontal plane, and by mounting signal output portion 115 of the test signal generator 110 to be displaceable in a vertical direction. Further, it is also possible to move manually the test signal generator 110.

The above-mentioned components may be mounted on a table 100 which may include a metal sheet or plate on its surface to be used as a coupling plane as defined in a standard, such as the IEC 61000-4-2 standard. Further, it is to be understood that not necessarily all components of the test signal generator 110 have to be movable with respect to the test board assembly 130. For example, the test signal generator 110 may be coupled to a stationary external control unit or to a stationary external high-voltage source by suitable cables. Further, a reference signal terminal of the test signal generator 110 may be coupled to the test board assembly 130 by a suitable cable connection or the like, without affecting the relative movement of the test signal generator 110 and the test board assembly 130. In some embodiments, only the signal output portion 115 of the test signal generator 110 may be moveable with respect to the test board assembly 130.

Figure 2:
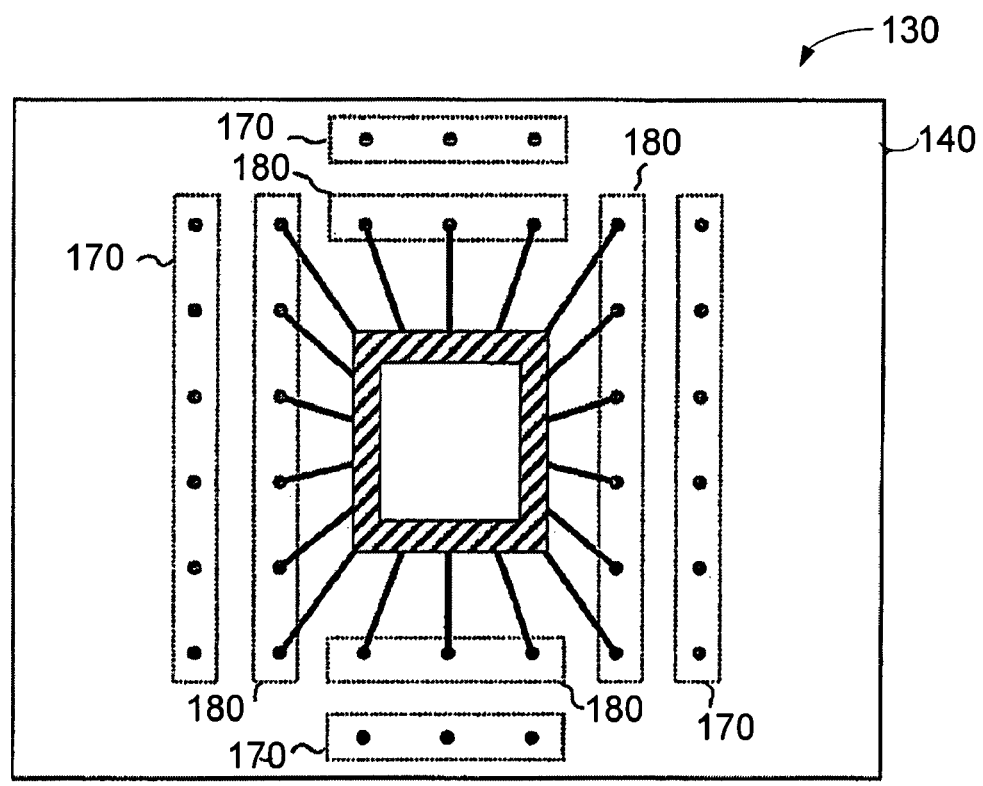
FIG. 2 schematically represents a test board assembly in accordance with at least one aspect of the present invention.

FIG. 2 schematically illustrates a test board assembly 130 in accordance with at least one aspect of the present invention. The test board assembly 130 comprises a printed circuit board 140. The receiving section is implemented by means of a connector socket 190 mounted on the printed circuit board 140. The connector socket 190 is configured to receive the integrated circuit to be tested. Different types of connector sockets may be used according to the type of integrated circuit to be tested.

As further illustrated, a first group of connection terminals 170 and a second group of connection terminals 180 are arranged on the printed circuit board 140. According to an embodiment, the connection terminals 170, 180 are implemented by pins protruding from the surface of the printed circuit board 140. In other embodiments, the connection terminals may be implemented in a different manner, e.g., by recesses or by substantially flat electrodes.

The connection terminals 180 of the second group are each coupled to a respective terminal of the connector socket 190 to couple to a respective input pin of the integrated circuit to be tested. It is to be understood that the arrangement is not limited to a one-to-one correspondence between the connection terminals 180 and the terminals of the connector socket 190 or the integrated circuit to be tested. For example, a terminal of the connector socket 190 or integrated circuit also may be coupled to two or more of the connection terminals 180. According to another embodiment, the implementation of connections on the printed circuit board and/or the type of the connector socket 190 are selected so as to provide small values of parasitic resistances, capacitances, and inductances of the test board assembly 130.

The test board assembly 130 according to the illustrated embodiment may be configured in a flexible manner. The connection terminals 170 of the first group and the connection terminals 180 of the second group may be coupled to each other in a flexible way to emulate characteristics of an electronic system in which the integrated circuit to be tested is to be used. According to an embodiment, this may be accomplished by removably coupling circuit component members of different types between the connection terminals 170 of the first group and the connection terminals 180 of the second group. According to an embodiment, the circuit component members are implemented in the form of jumpers to be set on at least one of the connection terminals 170 of the first group and at least one of the connection terminals 180 of the second group. Accordingly, a coupling between a connection terminal 170 of the first group and a connection terminal 180 of the second group may be established in a flexible and reconfigurable manner to emulate different system characteristics. A uniform spacing may be provided between the connection terminals 170, 180 to allow the same type of circuit component member to be used at different positions of the test board assembly 130.

In the illustrated embodiment, the connection terminals 170 of the first group do not have a direct connection to the connector socket 190, but the connection has to be established via the connection terminals 180 of the second group. Typically, the signal output portion 115 is coupled to one of the connection terminals 170 of the first group, and the test signal is then supplied to the integrated circuit 200 inserted into the connector socket 190 via a circuit component member coupled to the connection terminal 170 of the first group and to a connection terminal 180 of the second group. Accordingly, the connection terminals 170 of the first group have the purpose of receiving an input signal and may be referred to as input connection terminals, and the connection terminals 180 of the second group have the purpose of coupling the integrated circuit 200 to be tested to a circuit component member and may be referred to as component connection terminals. However, it is to be understood that the signal output portion 115 of the test signal generator 110 also may be directly coupled to a connection terminal 180 of the second group, and that the connection terminals 170 of the second group may be used for the purpose of coupling circuit component members to the integrated circuit 200 to be tested as well. In the illustrated embodiment, the connection terminals 170 of the first group may be used both as input connection terminals and as component connection terminals. Similarly, the connection terminals 180 of the second group may be used both as input connection terminals and as component connection terminals.

Figure 3:
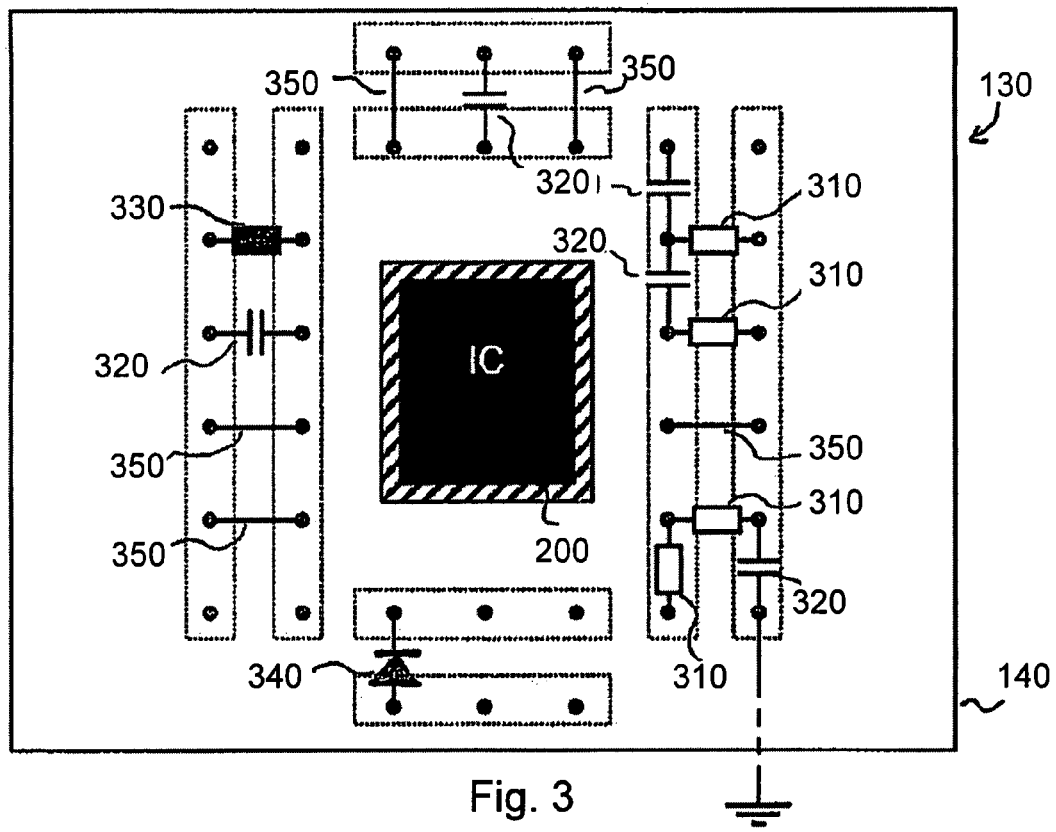
FIG. 3 schematically represents the test board assembly of FIG. 2 in an illustrative test configuration in accordance with at least one aspect of the present invention.

FIG. 3 schematically illustrates an illustrative test configuration of the test board assembly 130 as illustrated in FIG. 2 in accordance with at least one aspect of the present invention. In this illustrative test configuration, different types of circuit component members 310, 320, 330, 340, and 350 are coupled to the connection terminals 170 and 180. For clarity, the reference signs of the connection terminals 170, 180 and of the connector socket 190 are not shown in FIG. 3. Similarly, the connections between the connection terminals 180 of the first group and the connector socket 190 are not illustrated.

As illustrated, the circuit component members 310, 320, 330, 340, and 350 each include a circuit element selected from a group comprising a resistor, a capacitor, an inductor, a diode, and a wired connection. In the embodiment of FIG. 3, the circuit component members 310 each include a resistor, the circuit component members 320 each include a capacitor, the circuit component member 330 includes an inductor, the circuit component number 340 includes a diode, and the circuit component members 350 includes a wired connection. As mentioned above, the circuit component members may be implemented as jumpers to be connected removably to the printed circuit board 140. As further illustrated, one or more of the connection terminals 170, 180 may be coupled to a reference potential, e.g., ground. The reference potential may be the same as that of the test signal generator 110.

Further, it is to be understood that other types of circuit component members may comprise more of the illustrated circuit elements or other circuit elements, e.g., an integrated circuit. For example, a circuit component member may comprise a resistor and a capacitor connected in parallel.

Figure 4:
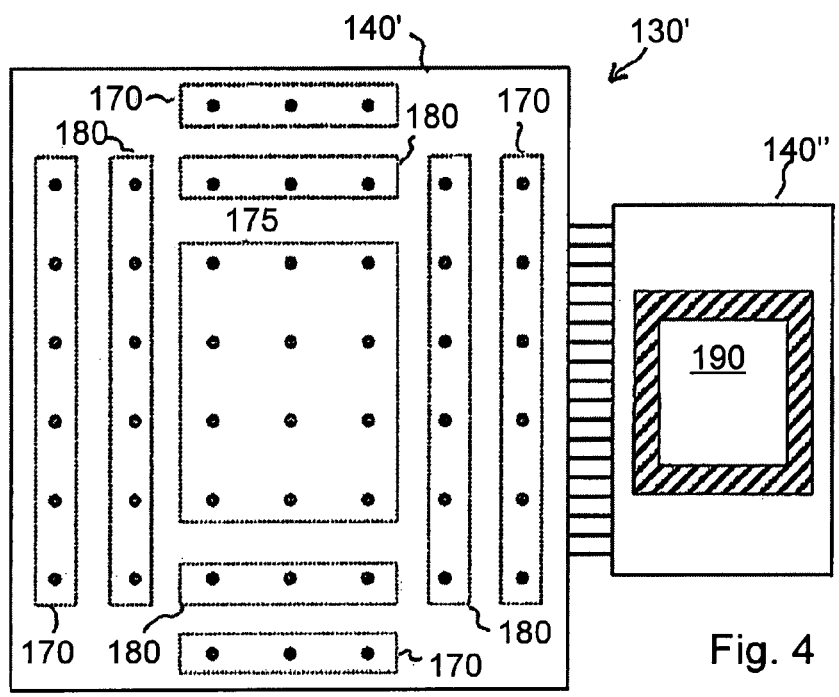
FIG. 4 schematically illustrates a test board assembly in accordance with at least one aspect of the present invention.

FIG. 4 schematically illustrates a test board assembly 130' in accordance with at least one aspect of the present invention. The test board assembly 130' generally has similar characteristics as the test board assembly 130 of FIG. 2, and in FIG. 4, components corresponding to those of FIG. 2 have been designated by the same reference signs. In the following, only the differences of the test board assembly 130' as compared to the test board assembly 130 are described below.

As compared to the test board assembly 130, which is implemented based on a single printed circuit board 140, the test board assembly 130' includes a first printed circuit board 140' and a second printed circuit board 140". The connector socket 190 for receiving the integrated circuit 200 to be tested is arranged on the second printed circuit board 140". The connection terminals 170 of the first group and the connection terminals 180 of the second group are arranged on the first printed circuit board 140'. The connection terminals of the second group 180 are coupled to the connector socket 190 by wired connections provided between the first printed circuit board 140' and the second printed circuit board 140".

Further, the first printed circuit board 140' includes a third group of connection terminals 175. The third group of connection terminals 175 may be used as input connection terminals and/or as component connection terminals. The additional group of connection terminals 175 provides further flexibility with respect to the configuration of the test board assembly 130'. The test board assembly 130' may be used in connection with the same circuit component members as explained in connection with FIG. 3. In other embodiments, the third group of connection terminals 175 may be omitted.

The operation of the ESD test system according to the above embodiments may be as follows. The integrated circuit 200 to be tested is coupled to the test board assembly 130, 130' and the test board assembly 130, 130' is configured to emulate system characteristics of an electronic system in which the integrated circuit 200 to be tested is intended to be used. This is accomplished by selectively providing connections between the connection terminals 170, 175, 180 of the test board assembly 130, 130', as explained in connection with FIG. 3. The test board assembly 130, 130' is placed in an operating range of the robotic system 120. Then, an ESD test signal or a sequence of ESD test signals is applied to the test board assembly 130, 130'. For this purpose, the robotic system 120 is controlled to move the signal output portion 115 of the test signal generator with respect to the test board assembly 130, 130' to couple the signal output portion 115 of the test signal generator 110 to one of the connection terminals 170, 175, 180. Then the ESD test signal is generated. After that, the signal output portion 115 of the test signal generator 110 may be moved to a further connection terminal 170, 175, 180 to apply a further test signal, or a further test signal, e.g., a test signal having different characteristics, may be applied to the same connection terminal 170, 175, 180. After applying the ESD test signal or after applying a sequence of ESD test signals, a functional test of the integrated circuit 200 may be performed to detect a failure. The test procedure may also include a reconfiguration of the test board assembly 130, 130'.

Figures 5, 6:
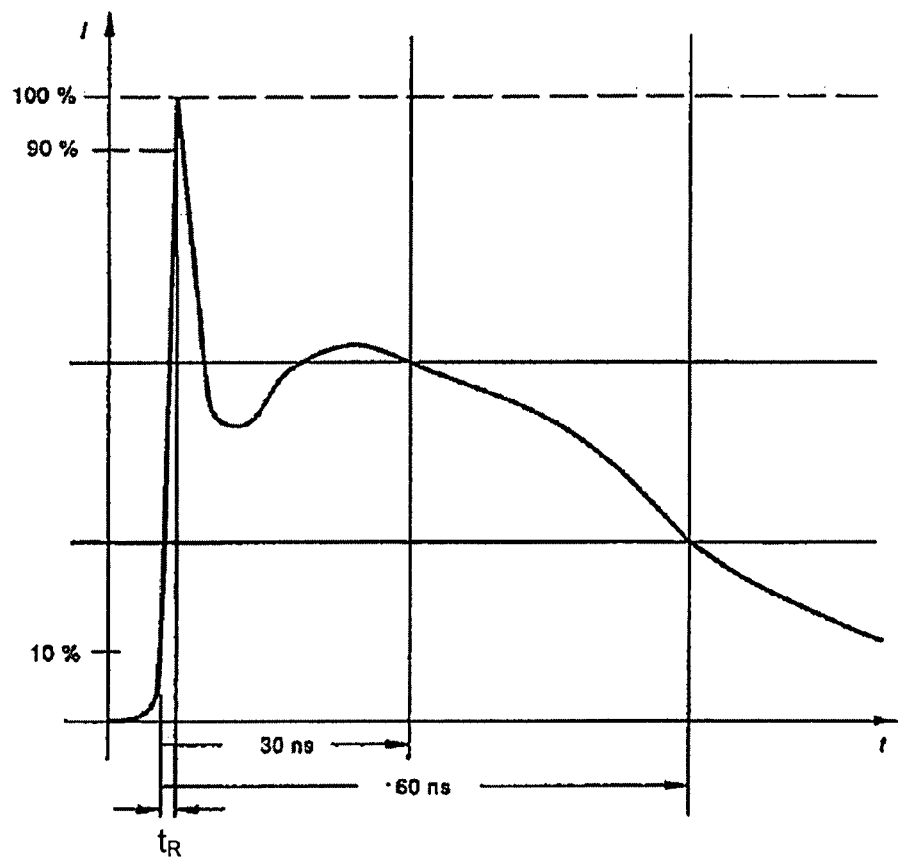
FIG. 5 illustrates the waveform of an illustrative system-level electrostatic discharge test signal in accordance with at least one aspect of the present invention.
FIG. 6 shows a table including waveform characteristics of system-level electrostatic discharge test signals as illustrated in FIG. 5 in accordance with at least one aspect of the present invention.

FIG. 5 schematically illustrates a typical waveform of the output current of the test signal generator 110 corresponding to a system-level ESD test signal according to a standard, such as the IEC 61000-4-2 standard, in accordance with at least one aspect of the present invention. The time is denoted by t and the output current is denoted by I. Characteristic parameters of the test signal are the initial rise time $t_R$ of the output current, the output current value after 30 ns, and the output current value after 60 ns. The general waveform is characterized by a steep initial increase followed by a fast initial decay and a slower further decay.

FIG. 6 includes a table of characteristic values of the waveform as illustrated in FIG. 5, in accordance with a standard, such as the IEC 61000-4-2 standard, in accordance with at least one aspect of the present invention. The table of FIG. 6 refers to four different levels of the test signal.

According to a first level, a test voltage of 2 kV is provided, and a first peak current of discharge is about 7.5 A. The output current at 30 ns is about 4 A, and the output current at 60 ns is about 2 A.

According to a second level, a test voltage of 4 kV is provided, and the first peak current of discharge is about 15 A. The output current at 30 ns is about 8 A, and the output current at 60 ns is about 4 A.

According to a third level, a test voltage of 6 kV is provided, and a first peak current of discharge is about 22.5 A. The output current at 30 ns is about 12 A, and the output current at 60 ns is about 6 A.

According to a fourth level, a test voltage of 8 kV is provided, and a first peak current of discharge is about 30 A. The output current at 30 ns is about 16 A, and the output current at 60 ns is about 8 A. For all levels of the test signal, the initial rise time $t_R$ is between 0.7 and 1 ns.

The tolerance level of the first peak current of discharge is ±10%, and the tolerance level of the output currents at 30 ns and at 60 ns is ±30%.

According to other embodiments, different types of waveforms may be used for the system-level ESD test signal. For example, it could be implemented by square-wavepulse signals of corresponding amplitudes.

Figure 7:
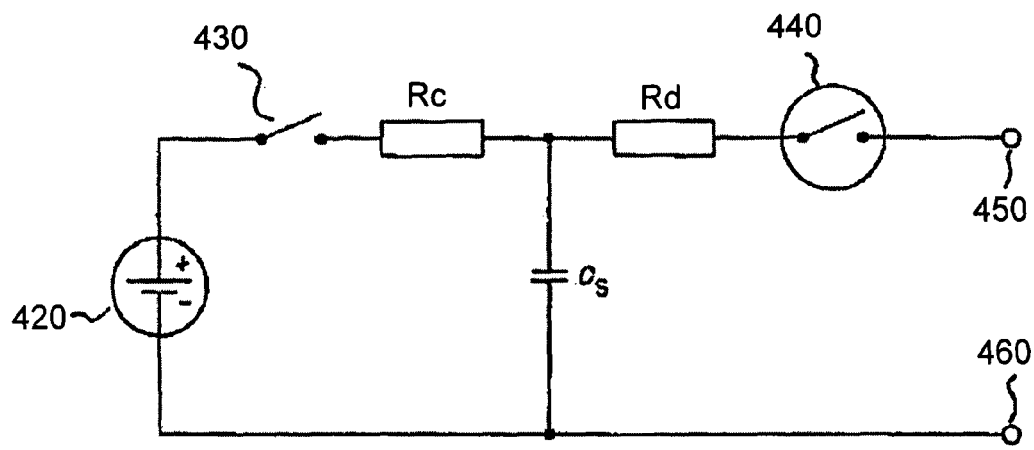
FIG. 7 schematically illustrates a circuit configuration of a test signal generator for generating system-level electrostatic discharge test signals in accordance with at least one aspect of the present invention.

FIG. 7 schematically represents a basic electronic circuit configuration of the test signal generator 110 of FIG. 1 in accordance with at least one aspect of the present invention.

According to an embodiment, the test signal generator is implemented according to a standard, such as the IEC 61000-4-2 standard, and includes a charging resistor $R_c$, an energy-storage capacitor $C_s$, a distributed capacitance $C_d$, a discharge resistor $R_d$, and a DC high voltage source 420.

Further, as illustrated in FIG. 7, the circuit may include a charging switch 430 and a discharging switch 440. In FIG. 7, a test signal output terminal is denoted by reference sign 450, and a connection terminal with respect to a reference potential is denoted by reference sign 460. As the distributed capacitance $C_d$ exists between the test signal generator 110 and its surrounding environment, e.g., the test board assembly

130, 130', a ground plane or a coupling plane, it is not illustrated in FIG. 7. Typically, the connection terminal 460 is coupled to a reference potential by a discharge return cable.

In order to comply with a standard, such as the standard IEC 61000-4-2, the test signal generator 110 may be required to meet the following specifications:

energy storage capacitance ($C_s+C_d$): 150 pF±10%;
discharge resistance ($R_d$): 330Ω±10%;
charging resistance ($R_c$): between 50 MΩ and 100 MΩ;
output voltage: up to 15 kV (nominal).

A tolerance of output voltage indication should be ±5%, the polarity of the output voltage should be switchable between positive and negative. A holding time, i.e., an interval of time in which the decrease of the test voltage due to leakage, prior to the discharge, is not greater than 10%, should be at least 5 s, and the test signal generator should at least be provided with a single-discharge mode of operation.

According to an illustrative embodiment, the test signal generator 110 may be operated as follows. The storage capacitor $C_s$ is charged by opening the discharge switch 440 and closing the charge switch 430. Then, the charge switch 430 is opened. After coupling the signal output portion 115 of the test signal generator 110 to a connection terminal of the test board assembly 130, 130', the discharge switch 440 is opened and the test signal is applied to the test board assembly 130, 130' via the test signal output terminal 450 and the signal output portion 115.

According to an embodiment, the signal output portion 115 of the test signal generator 110 as illustrated in FIG. 1 is provided with a flexibly mounted connection pin. The connection pin is provided with a complementary shape with respect to pins of the connection terminals 170, 175, 180 as illustrated in FIGS. 2, 3, and 4. In other embodiments, the connection pin of the signal output portion may be rigidly mounted.

Figure 8A:
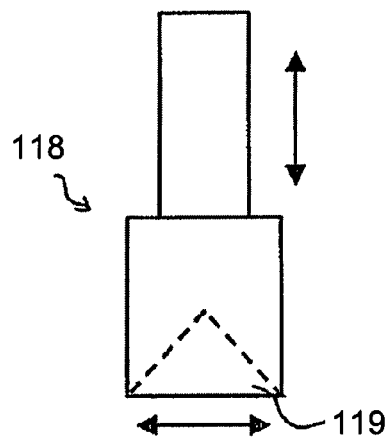
FIGS. 8(A) and (B) each schematically illustrates a connection pin of a test signal generator in accordance with at least one aspect of the present invention.
Figure 8A:
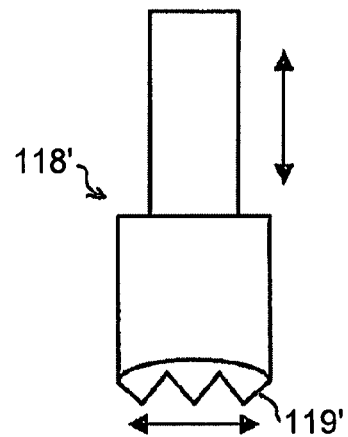
Figure 8A:
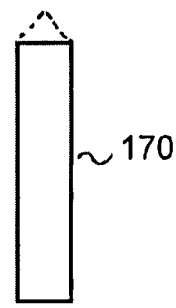
Figure 8B:
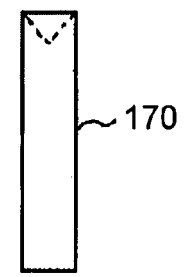

FIGS. 8(A) and 8(B) schematically illustrate implementations of a connection pin of the test signal generator 110 in accordance with at least one aspect of the present invention. According to a first embodiment as illustrated in FIG. 8(A), a connection pin 118 is provided with a receiving portion shaped as a recess 119 configured to receive therein the tip of a pin of the connection terminal 170 of the test board assembly 130, 130'. The recess has a tapered shape, e.g., a conical shape with an opening angle of about 90°. Further, the connection pin 118 is flexibly mounted to the output portion 115 of the test signal generator 110, as schematically illustrated by the double-headed arrows. Such type of flexibly mounted connection pin may also be referred to as "pogopin". The recess 119 provides the pogopin with a self-centering function with respect to the pin of the connection terminal 170.

FIG. 8(B) illustrates an alternative embodiment of the connection pin 118' of the test signal generator 110. For receiving the tip of a pin of a connection terminal 170 of the test board assembly 130, 130', the connection pin 118' is provided with a receiving portion 119' having a conically shaped recess with a central conical protrusion. The central conical protrusion may be brought into alignment with a mating recess of the tip of the pin of the connection terminal 170. In addition, in this case, a self-centering function of the pogopin is provided.

As further illustrated in FIGS. 8(A) and 8(B), in case of using the pogopin 118, the pins of the connection terminals 170 may be provided with a conically shaped tip, and in case of using the pogopin 118', the tips of the pins of the connection terminals 170 may be provided with a conically shaped recess. It is to be understood, that not only the pins of the connection terminal 170, but also the pins of the connection terminals 175 and 180 may be provided with the shapes as illustrated in FIGS. 8(A) and (B).

The above-described embodiments may allow for characterizing an integrated circuit with respect to its system-level ESD robustness before setting up the actual system. This increases the efficiency of designing the integrated circuit and electronic systems including the integrated circuit.

It is to be understood that various modifications are possible within the above-described embodiments. For example, the configuration of the test board assembly to emulate system characteristics may use other or additional means than jumpers, e.g., switches, cable connections, or the like. Further, the invention is not limited to having a flexibly mounted pin at the output portion of the test signal generator. It is also possible to have flexibly mounted pins on the test board assembly, in addition or as an alternative to fixedly mounted pins. Various shapes of the pogopin and of the corresponding pins of the test board assembly are conceivable to achieve a self-centering function. Moreover, the coupling of the integrated circuit to be tested to the test board assembly is not limited to using a connector socket. Other ways of coupling may be used as well, e.g., direct soldering of the integrated circuit to a printed circuit board of the test board assembly. Finally, it is to be understood that the test board assembly is not limited to having one or two printed circuit boards. Rather, the number of printed circuit boards and their respective design may be selected according to the specific requirements concerning the electronic system to be emulated. Features of the above-explained embodiments may be combined with each other as appropriate.

The invention claimed is:

1. An electrostatic discharge test system, comprising:
   a test signal generator configured to generate an electrostatic discharge test signal of a system-level type, the electrostatic discharge test signal substantially corresponding to one of the IEC 61000-4-2 standard and a standard derived there from;
   a test board assembly configured to receive an integrated circuit to be tested and configured to emulate characteristics of a system in which the integrated circuit is to be used, the test board assembly including a plurality of component connection terminals, each of the plurality of component connection terminals configured to be coupled removably to at least one circuit component member; and
   the at least one circuit component member,
   wherein the test signal generator and the test board assembly are configured to be coupled to each other to supply the electrostatic discharge test signal to the test board assembly when the test board assembly is configured to emulate characteristics of the system,
   wherein the at least one circuit component member comprises at least one of: a resistor, a capacitor, an inductor, a diode, and an integrated circuit.

2. The electrostatic discharge test system according to claim 1, wherein the test board assembly includes a plurality of input connection terminals, and the test signal generator includes a signal output portion configured to be coupled to one of the plurality of input connection terminals.

3. The electrostatic discharge test system according to claim 2, wherein the signal output portion and the test board assembly are movable with respect to each other.

4. The electrostatic discharge test system according to claim 2, further comprising a robotic system configured to move the signal output portion and the test board assembly with respect to each other.

5. The electrostatic discharge test system according to claim 4, wherein the robotic system includes a robotic arm configured to move the signal output portion of the test signal generator with respect to the test board assembly.

6. The electrostatic discharge test system according to claim 2, wherein each of the plurality of input connection terminals includes a first connection pin, and wherein the signal output portion of the test signal generator includes a second connection pin provided with a complementary shape with respect to the first connection pin.

7. The electrostatic discharge test system according to claim 6, wherein at least one of the first connection pin and the second connection pin is flexibly mounted.

8. The electrostatic discharge test system according to claim 6, wherein the second connection pin is flexibly mounted and includes a receiving portion configured to receive the first connection pin of one of the plurality of input connection terminals.

9. The electrostatic discharge test system according to claim 8, wherein the receiving portion includes a recess with an inwardly tapered shape.

10. The electrostatic discharge test system according to claim 1, wherein the component connection terminals are arranged with a uniform spacing.

11. The electrostatic discharge test system according to claim 1, wherein the circuit component member is configured to be coupled to at least two of the component connection terminals.

12. An electrostatic discharge test system, comprising:
    means for generating an electrostatic discharge test signal of a system-level type, the electrostatic discharge test signal substantially corresponding to one of the IEC 61000-4-2 standard and a standard derived there from; and
    means for receiving an integrated circuit to be tested, the means for receiving configured to emulate characteristics of a system in which the integrated circuit is to be used,
    wherein means for generating and means for receiving are configured to be coupled to each other to supply the electrostatic discharge test signal to the means for receiving when the means for receiving is configured to emulate characteristics of the system,
    wherein the means for receiving includes a plurality of input connection terminals and a plurality of component connection terminals, each of the plurality of component connection terminals configured to be coupled removably to at least one circuit component member,
    wherein the means for generating includes a signal output portion means coupled to one of the input connection terminals,
    wherein the at least one circuit component member comprises at least one of: a resistor, a capacitor, an inductor, a diode, and an integrated circuit.

13. A test board assembly for an electrostatic discharge test system, comprising:
    a receiving section configured to receive an integrated circuit to be tested;
    a plurality of input connection terminals, each input connection terminal configured to be coupled to a test signal generator to receive an electrostatic discharge test signal of a system-level type, the electrostatic discharge test signal substantially corresponding to one of the IEC 61000-4-2 standard and a standard derived there from;
    a plurality of component connection terminals, wherein each of the plurality of component connection terminals are configured to be coupled removably to at least one circuit component member; and
    the at least one circuit component member,
    wherein the test board assembly is configured to emulate characteristics of a system in which the integrated circuit is to be used when the electrostatic discharge test signal is received,
    wherein the at least one circuit component member comprises at least one of: a resistor, a capacitor, an inductor, a diode, and an integrated circuit.

14. The test board assembly according to claim 13, wherein the component connection terminals are arranged with a uniform spacing.

15. A method of conducting an electrostatic discharge test on an integrated circuit, comprising:
    configuring a test board assembly to emulate characteristics of a system in which an integrated circuit is to be used,
    coupling the integrated circuit to the configured test board assembly,
    removably coupling at least one circuit component member to the test board assembly, and
    applying an electrostatic discharge test signal of a system-level type to the configured test board assembly, the electrostatic discharge test signal substantially corresponding to one of the IEC 61000-4-2 standard and a standard derived there from,
    wherein the at least one circuit component member comprises at least one of: a resistor, a capacitor, an inductor, a diode, and an integrated circuit.

16. The method according to claim 15, further comprising selectively coupling a test signal generator to one of a plurality of input connection terminals of the test board assembly.

17. The method according to claim 16, further comprising controlling a robotic system to move the test board assembly and a signal output portion of the test signal generator with respect to each other.

* * * * *